(12) United States Patent
Shatalov et al.

(10) Patent No.: US 9,331,244 B2
(45) Date of Patent: May 3, 2016

(54) SEMICONDUCTOR STRUCTURE WITH INHOMOGENEOUS REGIONS

(71) Applicant: Sensor Electronic Technology, Inc., Columbia, SC (US)

(72) Inventors: Maxim S Shatalov, Columbia, SC (US); Alexander Dobrinsky, Loudonville, NY (US); Alexander Lunev, Columbia, SC (US); Rakesh Jain, Columbia, SC (US); Jinwei Yang, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 152 days.

(21) Appl. No.: 14/189,012

(22) Filed: Feb. 25, 2014

(65) Prior Publication Data
US 2014/0239312 A1    Aug. 28, 2014

Related U.S. Application Data

(60) Provisional application No. 61/768,581, filed on Feb. 25, 2013.

(51) Int. Cl.
  *H01L 33/00*  (2010.01)
  *H01L 33/32*  (2010.01)
  *H01L 33/10*  (2010.01)
  *H01S 5/022*  (2006.01)

(52) U.S. Cl.
  CPC .......... *H01L 33/32* (2013.01); *H01L 33/10* (2013.01); *H01S 5/0224* (2013.01)

(58) Field of Classification Search
  None
  See application file for complete search history.

(56) References Cited

U.S. PATENT DOCUMENTS

| 7,812,366 | B1 | 10/2010 | Sampath et al. |
|---|---|---|---|
| 2009/0272993 | A1* | 11/2009 | Cheong ............... H01L 33/10 257/94 |
| 2013/0146907 | A1 | 6/2013 | Lunev et al. |
| 2013/0320352 | A1 | 12/2013 | Gaevski et al. |
| 2014/0016660 | A1 | 1/2014 | Lunev et al. |

FOREIGN PATENT DOCUMENTS

WO     2013023197     2/2013

OTHER PUBLICATIONS

M. Shatalov, et al., "AlGaN Deep-Ultraviolet Light-Emitting Diodes with External Quantum Efficiency above 10%," Applied Physics Express, vol. 5, No. 8, p. 082101, Jul. 2012.

* cited by examiner

*Primary Examiner* — Evan Pert
*Assistant Examiner* — Shaka White
(74) *Attorney, Agent, or Firm* — LaBatt, LLC

(57) ABSTRACT

A semiconductor layer including a plurality of inhomogeneous regions is provided. Each inhomogeneous region has one or more attributes that differ from a material forming the semiconductor layer. The inhomogeneous regions can include one or more regions configured based on radiation having a target wavelength. These regions can include transparent and/or reflective regions. The inhomogeneous regions also can include one or more regions having a higher conductivity than a conductivity of the radiation-based regions, e.g., at least ten percent higher.

21 Claims, 12 Drawing Sheets

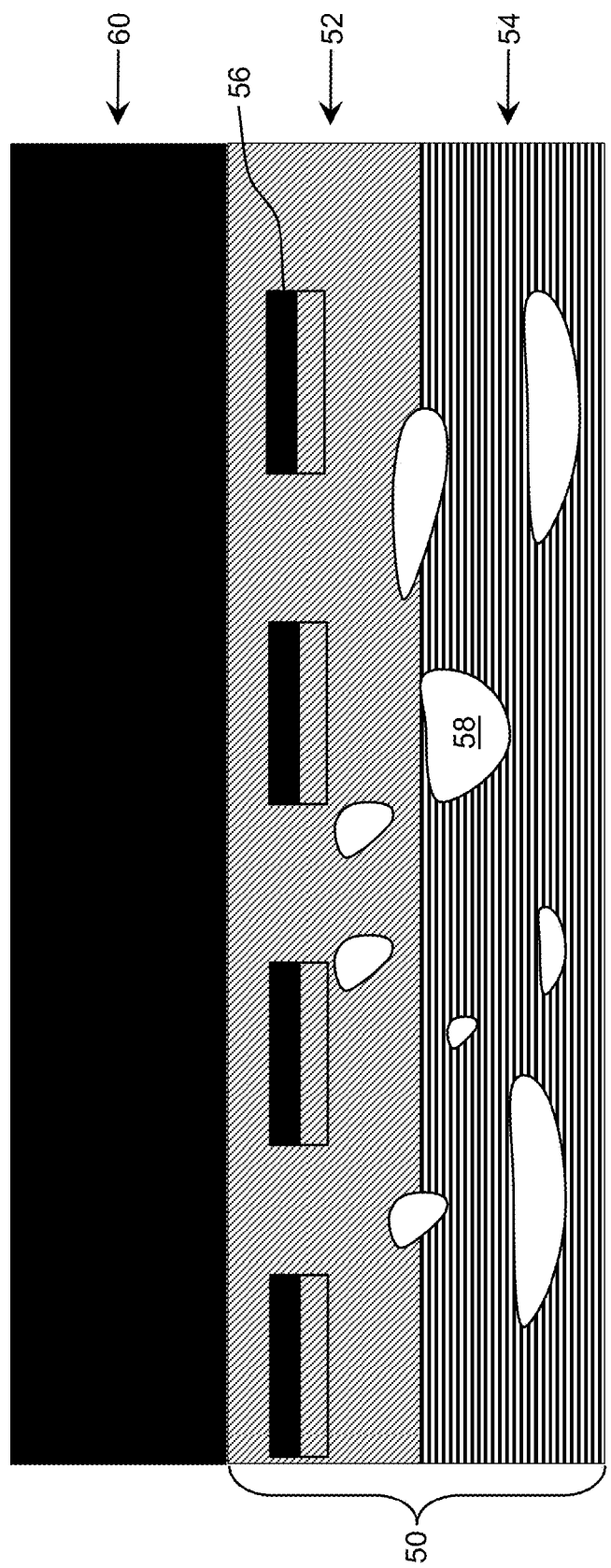

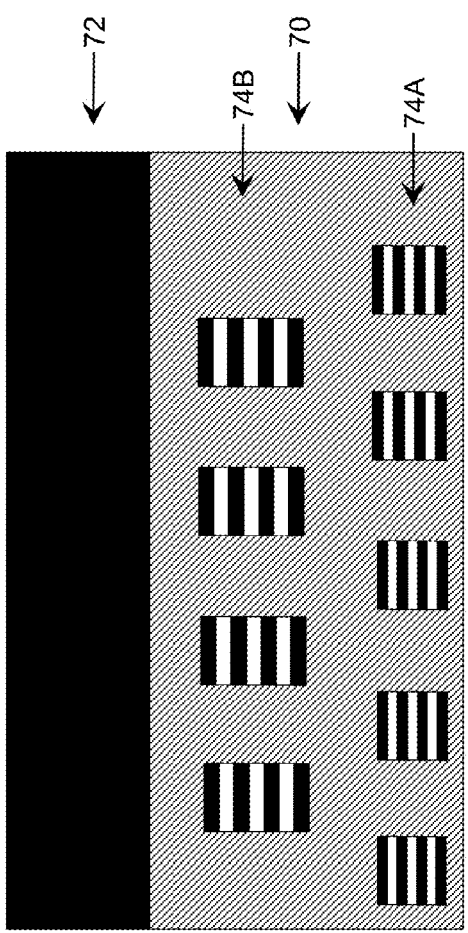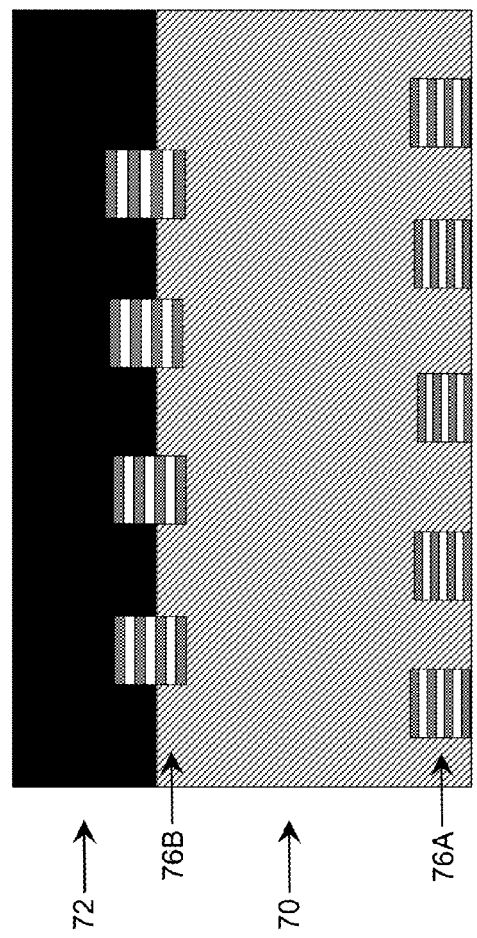

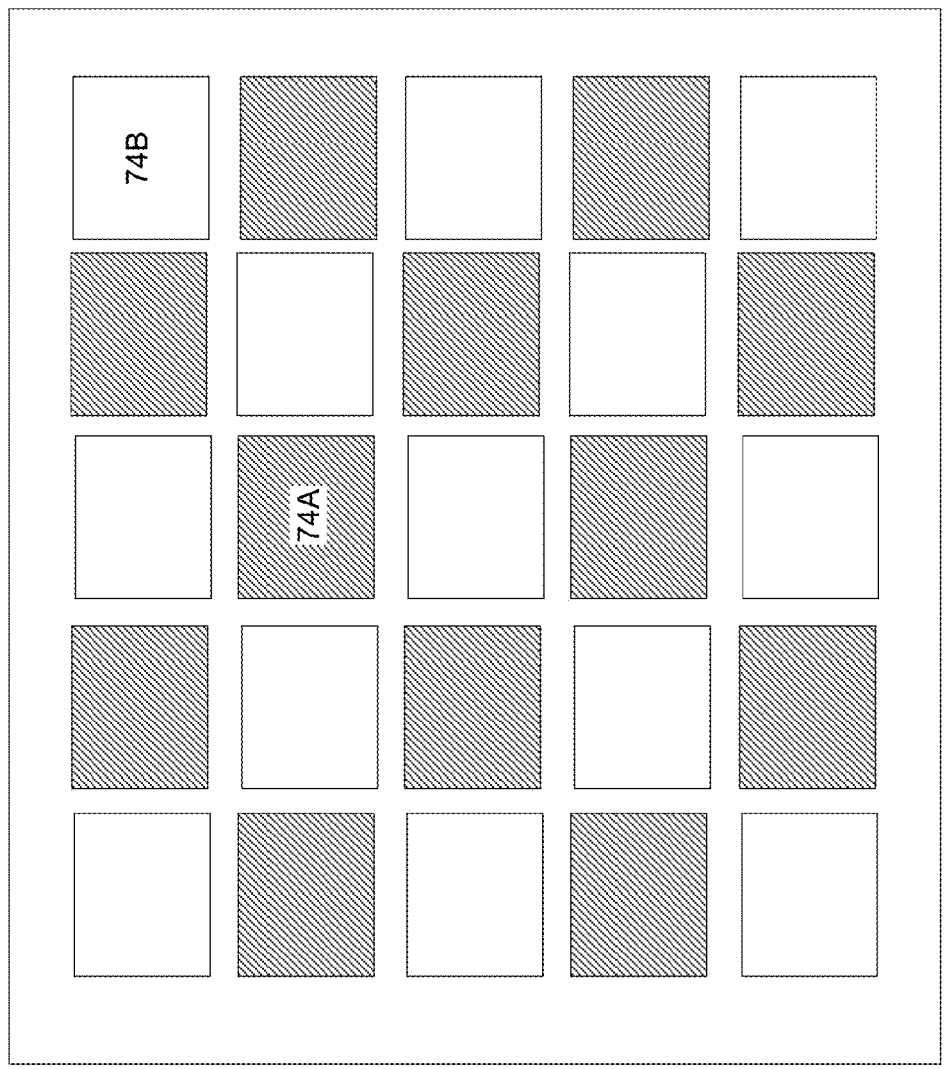

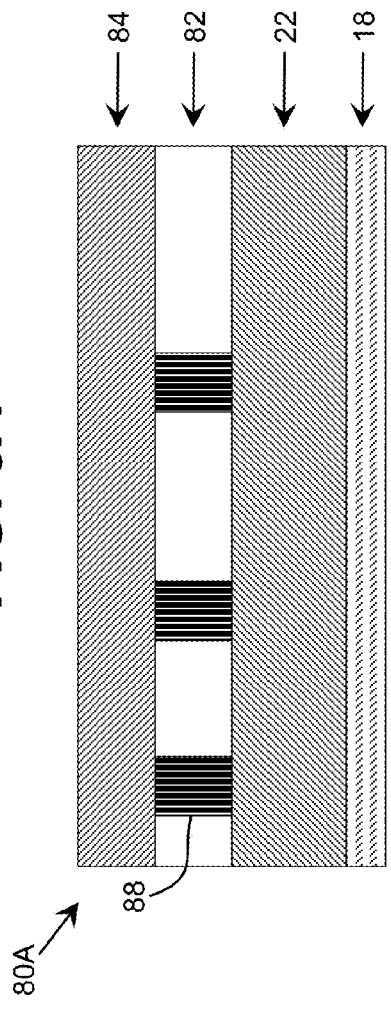
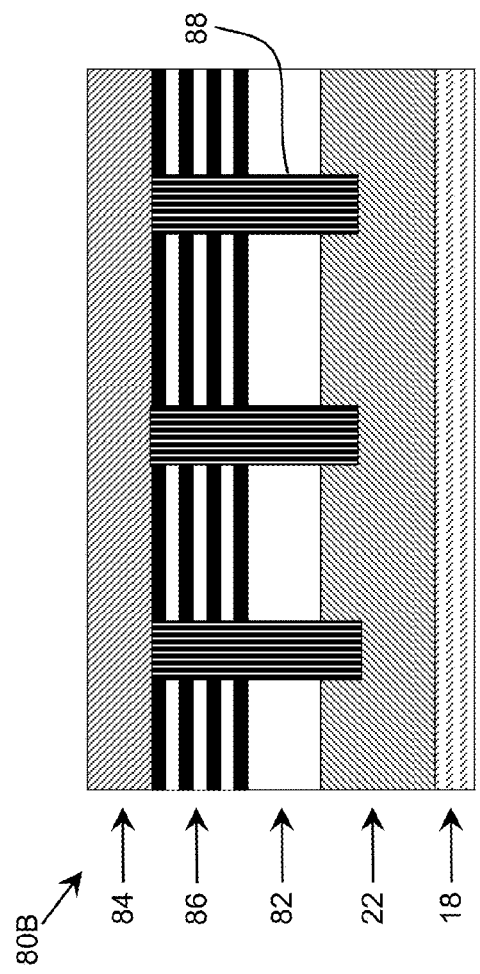

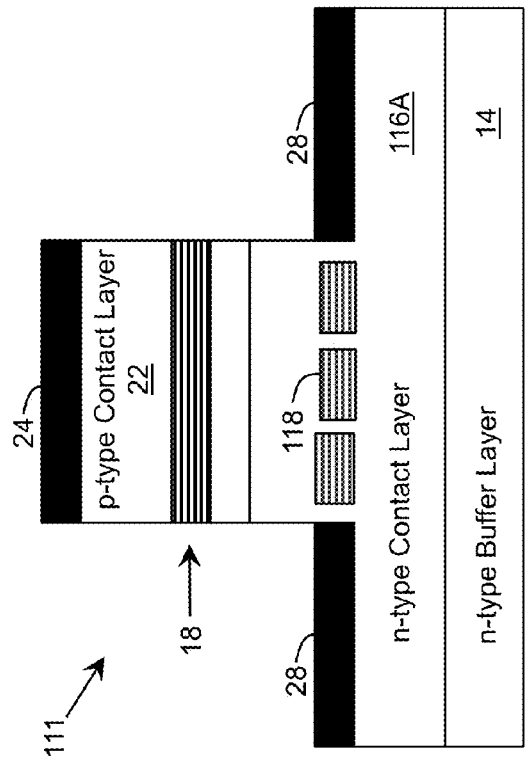
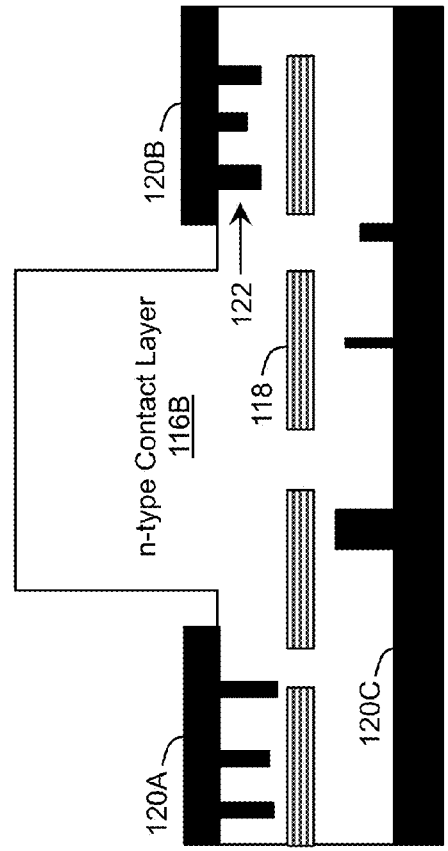

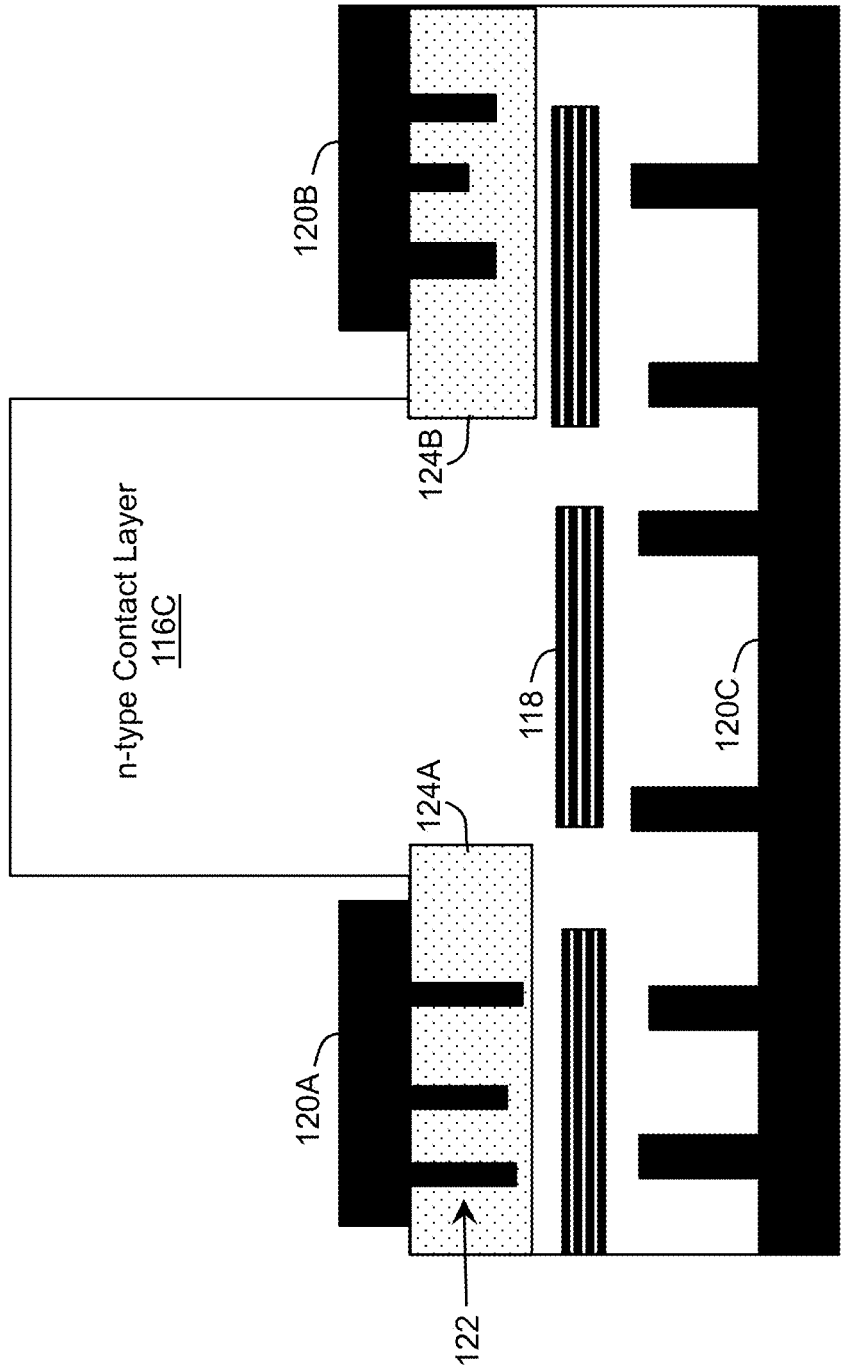

SEMICONDUCTOR STRUCTURE WITH INHOMOGENEOUS REGIONS

REFERENCE TO RELATED APPLICATIONS

The current application claims the benefit of U.S. Provisional Application No. 61/768,581, titled "Reflective, Transparent, Conductive Semiconductor Structure, Optoelectronic Device With The Same, and Method of Making The Same," which was filed on 25 Feb. 2013, and which is hereby incorporated by reference.

TECHNICAL FIELD

The disclosure relates generally to semiconductor devices, and more particularly, to emitting semiconductor devices, such as deep ultraviolet light emitting devices.

BACKGROUND ART

Semiconductor emitting devices, such as light emitting diodes (LEDs) and laser diodes (LDs), include, but are not limited to, solid state emitting devices composed of group III-V semiconductors. A subset of group III-V semiconductors includes group III-Nitride alloys, which can include binary, ternary and quaternary alloys of indium (In), aluminum (Al), gallium (Ga), and nitrogen (N). Illustrative group III-Nitride based LEDs and LDs can be of the form $In_yAl_xGa_{1-x-y}N$, where x and y indicate the molar fraction of a given element, $0 \leq x$, $y \leq 1$, and $0 \leq x+y \leq 1$. Other illustrative group III-Nitride based LEDs and LDs are based on boron (B) nitride (BN) and can be of the form $Ga_zIn_yAl_xB_{1-x-y}N$, where $0 \leq x$, y, $z \leq 1$, and $0 \leq x+y+z \leq 1$.

An LED is typically composed of semiconducting layers. During operation of the LED, a voltage bias applied across doped layers leads to injection of electrons and holes into an active layer where electron-hole recombination leads to light generation. Light is generated in the active layer with uniform angular distribution and escapes the LED die by traversing semiconductor layers in all directions. Each semiconducting layer has a particular combination of molar fractions for the various elements (e.g., given values of x, y, and/or z), which influences the optical properties of the semiconducting layer. In particular, a refractive index and absorption characteristics of a semiconducting layer are sensitive to the molar fractions of the semiconductor alloy forming the layer.

Current state of the art deep ultraviolet LEDs (DUV LEDs) have a low efficiency due to light trapping within the device, light absorption in the semiconductor layers, as well as light absorption in the contact regions. To improve light extraction efficiency for the DUV LEDs, one approach proposes a design using ultraviolet transparent p-type cladding and contact layers, an ultraviolet reflecting ohmic contact, and chip encapsulation having an optimized shape and refractive index.

SUMMARY OF THE INVENTION

Aspects of the invention provide a semiconductor layer including a plurality of inhomogeneous regions. Each inhomogeneous region has one or more attributes that differ from a material forming the semiconductor layer. The inhomogeneous regions can include one or more regions configured based on radiation having a target wavelength. These regions can include transparent and/or reflective regions. The inhomogeneous regions also can include one or more regions having a higher conductivity than a conductivity of the radiation-based regions, e.g., at least ten percent higher.

A first aspect of the invention provides a semiconductor heterostructure comprising: a group III nitride semiconductor layer including a plurality of inhomogeneous regions, each inhomogeneous region having a set of attributes differing from a group III nitride material forming the semiconductor layer, wherein the plurality of inhomogeneous regions include: a set of first inhomogeneous regions configured based on radiation having a target wavelength, wherein the set of first inhomogeneous regions are at least one of: transparent to the radiation or reflective of the radiation; and a set of second inhomogeneous regions having a conductivity at least ten percent higher than a conductivity of the set of first inhomogeneous regions, wherein each of the sets of inhomogeneous regions occupy at least five percent of at least one of: a lateral planar area of the semiconductor layer or a volume of the semiconductor layer, and wherein at least some of the sets of inhomogeneous regions do not fully overlap.

A second aspect of the invention provides an optoelectronic device comprising: an active region; a p-type contact layer located on a first side of the active region; and a n-type contact layer located on a second side of the active region, wherein at least one of the contact layers comprises a group III nitride semiconductor layer including a plurality of inhomogeneous regions, each inhomogeneous region having a set of attributes differing from a group III nitride material forming the semiconductor layer, wherein the plurality of inhomogeneous regions include: a set of first inhomogeneous regions configured based on radiation having a target wavelength, wherein the set of first inhomogeneous regions are at least one of: transparent to the radiation or reflective of the radiation; and a set of second inhomogeneous regions having a conductivity at least ten percent higher than a conductivity of the set of first inhomogeneous regions, wherein each of the sets of inhomogeneous regions occupy at least five percent of at least one of: a lateral planar area of the semiconductor layer or a volume of the semiconductor layer, and wherein at least some of the sets of inhomogeneous regions do not fully overlap.

A third aspect of the invention provides a method comprising: fabricating a semiconductor heterostructure, wherein the semiconductor heterostructure comprises: a group III nitride semiconductor layer including a plurality of inhomogeneous regions, each inhomogeneous region having a set of attributes differing from a group III nitride material forming the semiconductor layer, wherein the plurality of inhomogeneous regions include: a set of first inhomogeneous regions configured based on radiation having a target wavelength, wherein the set of first inhomogeneous regions are at least one of: transparent to the radiation or reflective of the radiation; and a set of second inhomogeneous regions having a conductivity at least ten percent higher than a conductivity of the set of first inhomogeneous regions, wherein each of the sets of inhomogeneous regions occupy at least five percent of at least one of: a lateral planar area of the semiconductor layer or a volume of the semiconductor layer, and wherein at least some of the sets of inhomogeneous regions do not fully overlap.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 3A shows a layer including a plurality of reflective regions while

FIG. 4 shows an illustrative semiconductor structure according to an embodiment.

FIGS. 7A-7C show illustrative arrangements of reflective regions according to embodiments.

FIGS. 8A and 8B show illustrative reflective regions comprising omnidirectional mirrors according to embodiments.

FIGS. 11A-11C show illustrative n-type contact layers including reflective regions according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a semiconductor layer including a plurality of inhomogeneous regions. Each inhomogeneous region has one or more attributes that differ from a material forming the semiconductor layer. The inhomogeneous regions can include one or more regions configured based on radiation having a target wavelength. These regions can include transparent and/or reflective regions. The inhomogeneous regions also can include one or more regions having a higher conductivity than a conductivity of the radiation-based regions, e.g., at least ten percent higher. As used herein, unless otherwise noted, the term "set" means one or more (i.e., at least one) and the phrase "any solution" means any now known or later developed solution.

Aspects of the invention provide a semiconductor structure (e.g., a semiconductor layer) that can be incorporated into an optoelectronic device, such as a light emitting diode (LED), light emitting laser, light sensor, photodetector, avalanche diode, and/or the like. The semiconductor structure can include inhomogeneous regions formed by one or more of: patterning, masking, epitaxial growth, epitaxial overgrowth, deposition techniques, and/or the like. Deposition techniques can include thermal evaporation, magnetron sputtering, ion-beam deposition, laser beam evaporation, and/or the like. In a more particular embodiment, the semiconductor structure comprises a group III nitride semiconductor layer. The inhomogeneous regions can include various types of inhomogeneous regions and can be located within the semiconductor structure in various arrangements. Aspects of the invention are further described in conjunction with emitting devices, such as group III nitride-based emitting devices, including an active region configured to generate radiation during operation of the device. However, it is understood that the invention can be applied to other types of optoelectronic devices.

Figure 1:
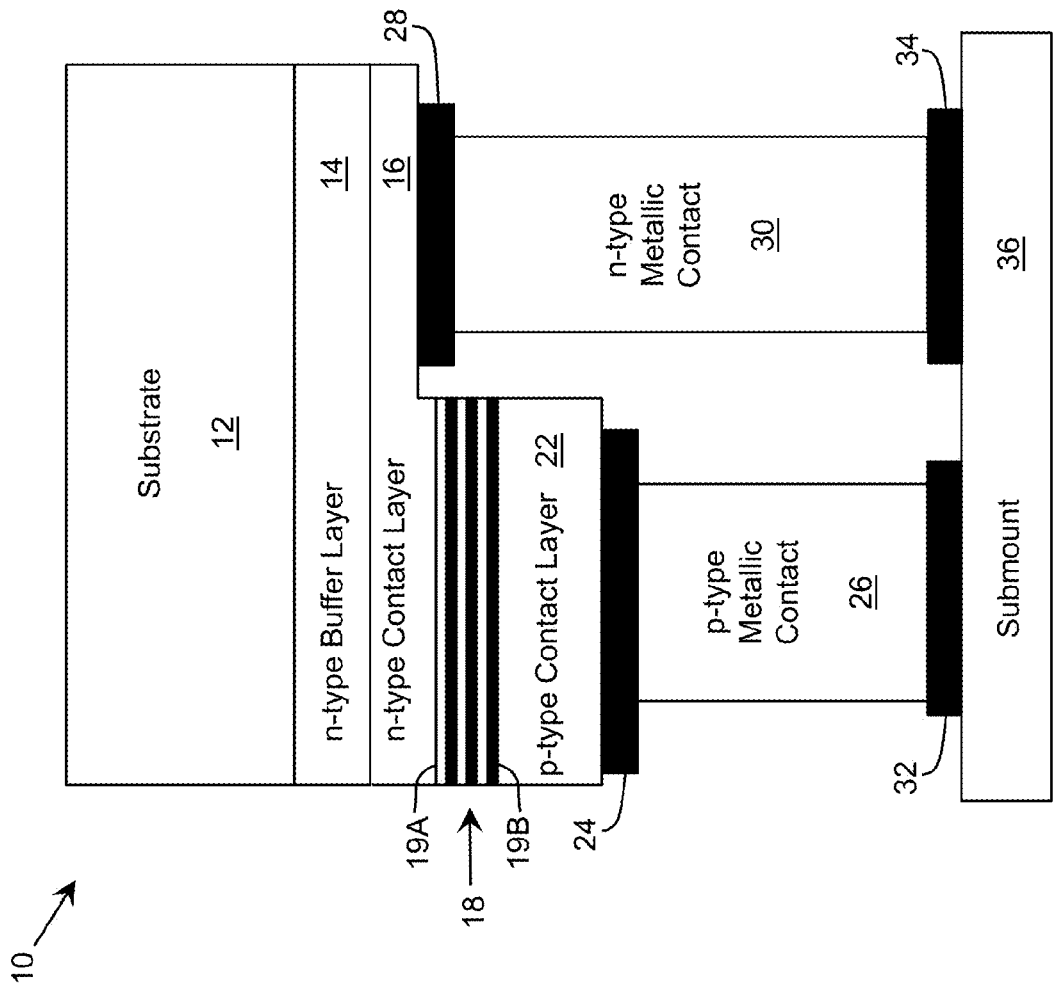
FIG. 1 shows a typical design of a flip-chip emitting device according to an embodiment.
Figure 2:
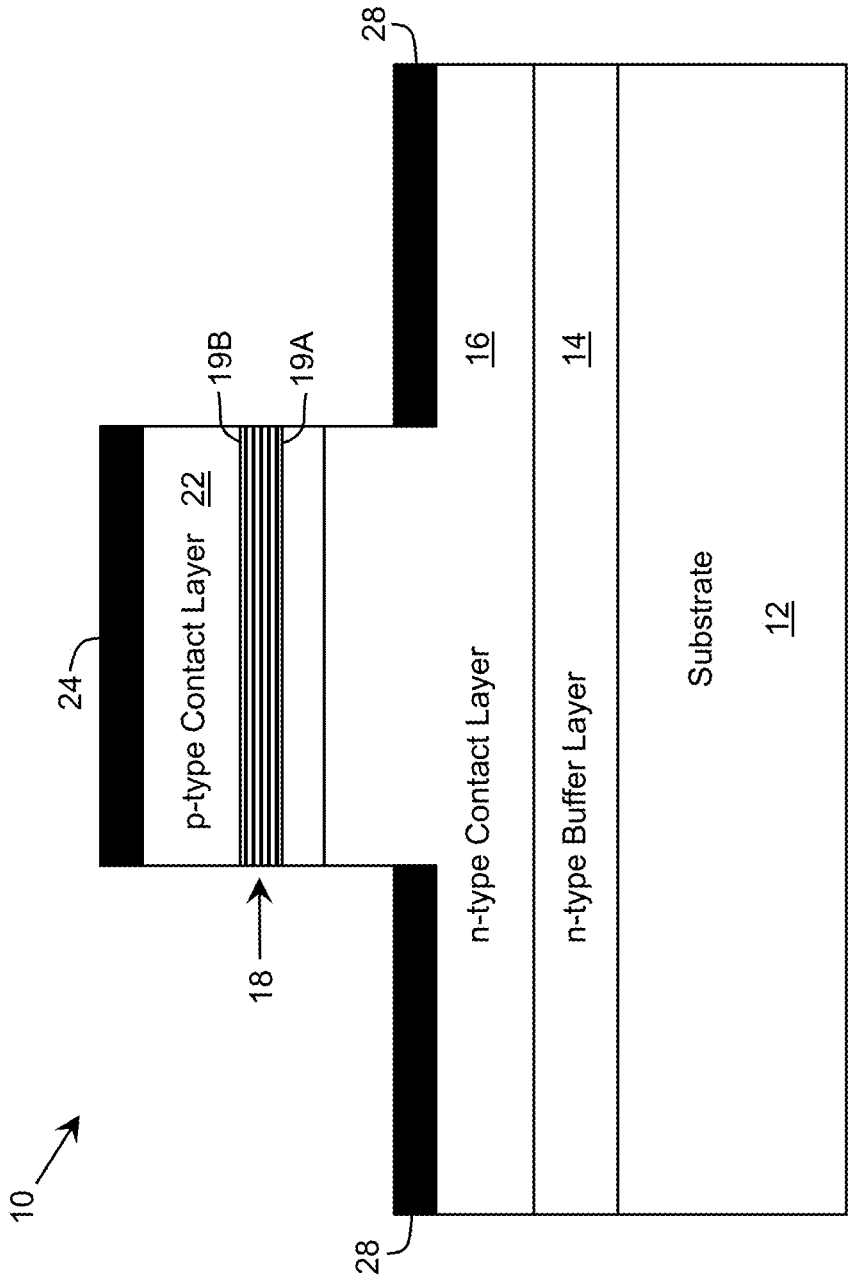
FIG. 2 shows a typical design of an emitting device including a mesa structure according to an embodiment.

Flip-chip technology is frequently utilized to control light extraction and thermal management of a LED, such as a deep ultraviolet (DUV) LED. Turning to the drawings, FIG. 1 shows a typical design of a flip-chip emitting device 10 according to an embodiment, while FIG. 2 shows a typical design of an emitting device 10 including a mesa structure according to an embodiment. In general, each emitting device 10 includes a semiconductor heterostructure having multiple semiconductor layers. Each semiconductor layer typically has lateral dimensions significantly larger than the layer height. Such a semiconductor layer is referred to herein as a planar layer and the discussion distinguishes between two directions: a direction in plane (e.g., extending right to left and into and out of the page in the drawing) and a direction perpendicular to the plane (e.g., extending top to bottom in the drawing). In a typical embodiment, the lateral dimensions of a layer can reach several square millimeters, whereas the height of the layer is typically measured in micrometers and nanometers. A planar area of the layer is typically referred to as the area of the layer or the area of the semiconductor structure. A lateral planar area is defined as an area of a surface of the semiconductor layer and is parallel to the surface of the substrate used for epitaxial growth.

As illustrated, each emitting device 10 includes a heterostructure comprising a substrate 12, a buffer layer 14 adjacent to the substrate 12, an n-type contact layer 16 (e.g., an electron supply layer) adjacent to the buffer layer 14, and an active region 18 having an n-type side 19A adjacent to the n-type cladding layer 16. Furthermore, the heterostructure of each emitting device 10 includes a p-type contact layer 22 (e.g., a hole supply layer) adjacent to a p-type side 19B of the active region 18. It is understood that the emitting devices 10 are only illustrative of various configurations of heterostructures. To this extent, a heterostructure can include one or more additional layers, which are not shown.

In a more particular illustrative embodiment, an emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_yAl_xGa_{1-x-y}N$, $Ga_zIn_yAl_{1-x-y-z}N$, an $Al_xGa_{1-x}N$ semiconductor alloy, or the like. Similarly, both the n-type contact layer 16 and the p-type contact layer 22 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 22. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like.

A p-type metal 24 can be attached to the p-type contact layer 22 and a n-type metal 28 can be attached to the n-type contact layer 16. The p-type metal 24 and the n-type metal 28 can form ohmic contacts to the corresponding layers 22, 16, respectively. As shown with respect to the emitting device 10 of FIG. 1, a p-type metallic contact 26 can be attached to the p-type metal 24 and an n-type metallic contact 30 can be attached to the n-type metal 28. In an embodiment, the p-type metal 24 and the n-type metal 28 each comprise several conductive and reflective metal layers, while the n-type metallic contact 30 and the p-type metallic contact 26 each comprise highly conductive metal.

In an embodiment, an emitting device 10 includes one or more layers, such as the n-type contact layer 16 and/or the p-type contact layer 22, formed of a semiconductor structure having one or more inhomogeneous regions located therein. The inhomogeneous regions can include one or more regions configured based on radiation having a target wavelength and/or one or more regions configured based on a desired conductivity. To this extent, the inhomogeneous regions can include one or more of: a set of transparent regions, a set of reflective regions, and/or a set of conductive regions. As used herein, a region is a transparent region when the region allows at least ten percent of radiation having a target wavelength, which is radiated at a normal incidence to an interface of the region, to pass there through. Furthermore, as used herein, a region is a reflective region when the region reflects at least ten percent of radiation having a target wavelength, which is radiated at a normal incidence to an interface of the region. In an embodiment, the target wavelength of the radiation corresponds to a wavelength of radiation emitted or sensed by the active region 18 during operation of the device 10. For a given layer, the wavelength can be measured in a material of consideration and can depend on a refractive index of the material.

A conductive region can be configured to promote conductivity of carriers in the semiconductor structure. A conductive region can have a higher concentration of carriers due to, for example, a locally reduced band gap of the semiconductor layer, a local high doping of the semiconductor layer, and/or the like. In an illustrative embodiment, the conductive region is formed of a group III nitride semiconductor material. In this case, a high local level of doping can be achieved by locally reducing an aluminum content, by polarization doping resulting in graded layers, and/or the like. Regardless, the improved conductivity can maintain an overall conductivity of the semiconductor structure. In an embodiment, a conductive region has a conductivity at least ten percent higher than a conductivity of a transparent region and a conductivity of a reflective region and a higher conductivity than a base semiconductor material for the layer.

A conductive region described herein can be anisotropic in the layer normal and/or lateral directions. For example, one or more of the conductive regions can have a high conductivity in a layer normal direction but not in the layer lateral direction, while one or more other conductive regions can have a high conductivity in the layer lateral direction but not in the layer normal direction. The conductive regions with high conductivity in the layer normal direction are referred to as regions with vertical conductivity, while conductive regions with high conductivity in the layer lateral direction are referred to as regions with horizontal conductivity. Similar to an isotropic conductive region, an anisotropic conductive region can have a conductivity in the preferred semiconductor direction that is at least ten percent higher than a conductivity of the reflective and transparent regions in the preferred direction.

Regions of each type (transparent, reflective, and conductive) can be incorporated into the semiconductor structure (e.g., a layer in the emitting device 10) and have an area that is a fraction of the area of the entire semiconductor structure. In an embodiment, the area of the region is approximately a few percent of the area of the semiconductor structure or more (e.g., greater than or equal to approximately three percent of the area of the semiconductor structure). Additionally, a region can have a height that is smaller than a height of the corresponding semiconductor structure. For example, a region can have a height that is fifty percent or ten percent of the height of the semiconductor layer. A region can be located anywhere within the semiconductor structure, including completely within the semiconductor structure or located adjacent to either planar side of the semiconductor structure. In an embodiment, the semiconductor structure includes multiple regions of the same type, which can be located in various portions of the semiconductor structure and can be present at different levels along a height of the semiconductor structure. To this extent, two or more of the regions of the same type can at least partially overlap with one another. In an embodiment, regions of the same type occupy at least five percent of the volume of the semiconductor structure. In another embodiment, regions of the same type occupy at least five percent of the lateral planar area of the semiconductor structure.

A semiconductor structure can include regions of one or more types. When regions of multiple types are included, the regions of different types can be located anywhere within the semiconductor structure with respect to one another. For example, a transparent region can be located adjacent to a reflective region, a conductive region can be located adjacent to a transparent region and/or a reflective region, and/or the like. Additionally, a single region can comprise both a transparent region, by allowing at least ten percent of radiation of a target wavelength to pass there through, and a reflective region, by reflecting at least ten percent of the radiation.

Figure 3A:
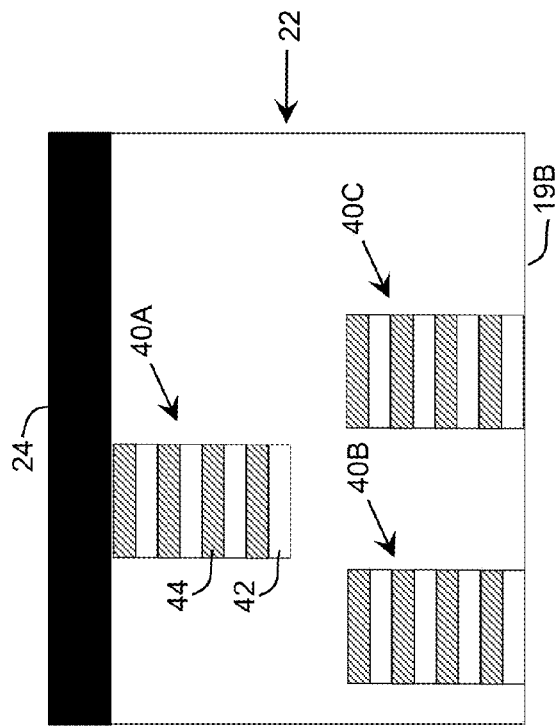
Figure 3B:
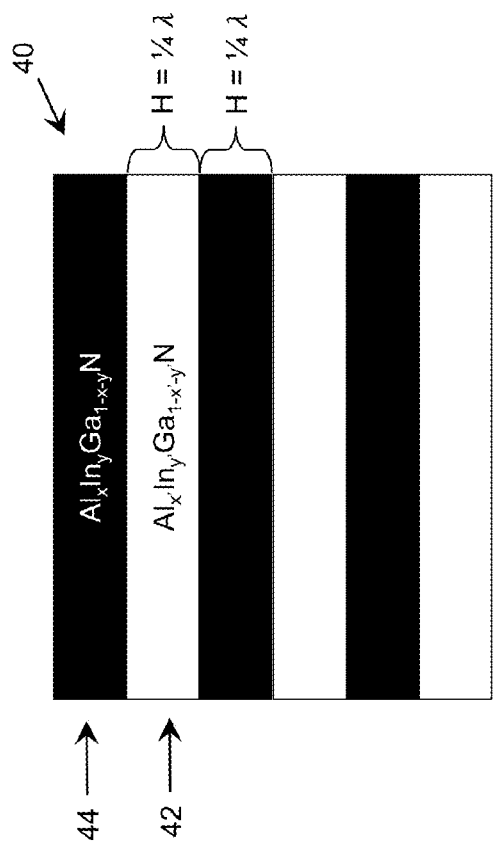
FIG. 3B shows an illustrative reflective region according to embodiments.

A reflective region can be formed of one or more composite mirrors. A composite mirror includes any structure having multiple sublayers of dielectric or metallic material. Such a composite mirror can be an omnidirectional mirror, which comprises a layer of material having a low index of refraction followed by a metallic reflector or a Bragg mirror. To this extent, FIG. 3A shows a layer including a plurality of reflective regions while FIG. 3B shows an illustrative reflective region according to embodiments. In FIG. 3A, the layer can correspond to a p-type contact layer 22, which is located adjacent to a p-type metal 24. However, it is understood that this is only illustrative. The p-type contact layer 22 is shown including three reflective regions 40A-40C located therein. As illustrated, each reflective region 40A-40C is located adjacent to a planar side of the p-type contact layer 22. However, it is understood that the number of and relative locations of the reflective regions 40A-40C are also only illustrative of various possible configurations.

As illustrated, a reflective region 40A-40C can be formed of a composite mirror having alternating sublayers of low index of refraction material 42 and relatively high index of refraction material 44 (e.g., a metallic reflector or a Bragg mirror). Furthermore, a sublayer of the reflective region 40A-40C closest to the p-type side 19B of the active region can be formed of a low index of refraction material 42. In an embodiment shown in FIG. 3B, a reflective region 40 (e.g., a Bragg mirror) can be epitaxially grown, and include a superlattice of group III nitride semiconductor sublayers 42, 44 of $Al_{x}In_{y}Ga_{1-x-y}N/Al_{x'}In_{y'}Ga_{1-x'-y'}N$, where x, y, x', and y' are chosen such that a refractive index of one sublayer is different from a refractive index of another sublayer by at least two percent (five percent in another embodiment). In a more particular embodiment, the refractive index of a group III nitride semiconductor alloy varies between values of 2.2 and 2.7 by adjusting a molar fraction of aluminum and/or indium. In an illustrative embodiment, x (the molar fraction of aluminum in one of the sublayers) is greater than 0.4. Only values with relatively high molar fractions are important in order to have Bragg mirrors with low absorption characteristics. Typical Bragg mirrors are designed to have alternative sublayers of low and high refractive index, with sublayer thicknesses being a quarter of a target wavelength ($\lambda$), wherein the target wavelength corresponds to a wavelength of radiation measured in the semiconductor material. In an embodiment, the Bragg mirror includes at least ten layers.

In an embodiment, a semiconductor structure, such as the p-type contact layer 22, includes a sufficient number and configuration of reflective regions 40A-40C (e.g., Bragg mirrors) to provide at least a ten percent reflectivity for the entire semiconductor structure 22. In another embodiment, the reflective regions 40A-40C also can serve as transparent regions, which concurrently transmit and reflect at least ten percent of the radiation. In still another embodiment, such a transparent and reflective region can reflect at least twenty percent of radiation having a target wavelength at the normal direction to the region surface.

A reflective region 40 can be formed using another deposition solution, such as thermal evaporation, magnetron sputtering, ion-beam deposition, laser beam evaporation, and/or the like. A reflective region 40 formed using an alternative solution to epitaxial growth can utilize one or more of a larger selection of materials for the sublayers. For example, a reflective region 40 can include sublayers of a low index of refraction material, such as silicon dioxide ($SiO_2$), magnesium oxide (MgO), magnesium fluoride ($MgF_2$), and/or the like, and sublayers of a high index of refraction material such as aluminum oxide ($Al_2O_3$), scandium oxide ($Sc_2O_3$), magnesium aluminum oxide ($MgAl_2O_3$), and a group III nitride (e.g., $Al_xIn_yGa_{1-x-y}N$). As a result, a larger variability in the refractive indices of the sublayers is possible. For example, the refractive index of one sublayer can differ from the refractive index of another sublayer by at least three percent (ten percent in a more particular embodiment). In an embodiment, a sublayer with a low index of refraction can be deposited followed by either a metallic reflector or a Bragg mirror. Similar to Bragg mirrors grown epitaxially, a thickness of each sublayer can be chosen to be a quarter of a target wavelength, where the target wavelength is the wavelength of the radiation measured in the sublayer material.

A semiconductor structure (e.g., the p-type contact layer 22) including transparent, reflective, and/or conductive regions can be fabricated using patterning. For example, an initial group III nitride semiconductor layer can be epitaxially grown on a surface, followed by deposition of transparent, reflective, and/or conductive (vertically and/or horizontally) region(s) over the semiconductor layer by means of thermal evaporation, magnetron sputtering, ion-beam deposition, laser beam evaporation, and/or the like. Alternatively, one or more of the regions can be epitaxially grown above the group III nitride semiconductor layer. The deposited region(s) can be patterned, e.g., using photolithography, which includes depositing a photoresist, exposing patterned areas to high intensity light, and etching the exposed areas. Some portions of the deposited region(s) can be etched, and group III nitride semiconductor layer is overgrown in the etched regions. The process of patterning can be repeated, again depositing a next layer of transparent, reflective, and/or conductive region(s). More complicated deposition and patterning are also possible, which can result in various arrangements of transparent, reflective, and/or conductive regions. For example, after etching portions of the deposited region(s), a second set of region(s) of a different type can be deposited in the etched regions (e.g., to form laterally adjacent regions of different types).

FIG. 4 shows an illustrative semiconductor structure 50 according to an embodiment. The semiconductor structure 50 includes a vertically conductive region 52 and a background base semiconductor structure 54 and is located adjacent to a metallic contact 60. In an embodiment, the background base semiconductor structure 54 comprises a group III nitride semiconductor layer, a structure composed of group III nitride semiconductor layers, or the like. In a more particular embodiment, the background base semiconductor structure 54 comprises a superlattice comprising $Al_xIn_yGa_{1-x-y}N/Al_{x'}In_{y'}Ga_{1-x'-y'}N$ sublayers. In this case, the superlattice can have an enhanced horizontal conductivity. The semiconductor structure 50 further includes reflective regions 56 (e.g., composite mirrors) and transparent regions 58. As illustrated, the transparent regions 58 can be located at several different levels within the semiconductor structure 50. Similarly, while not shown in FIG. 4, the reflective regions 56 can be located at different levels. A size of the regions 56, 58 can vary, e.g., based on a method utilized for fabricating such regions 56, 58. For example, regions 56, 58 formed using epitaxial growth can be ten to one thousand nanometers, whereas regions 56, 58 produced through patterning can result in a region size of several micrometers or larger.

In an embodiment, a semiconductor structure can include transparent regions and reflective regions interspersed with vertically conductive regions such that any lateral cross section of the semiconductor structure contains at least one transparent or reflective region and at least one vertically conductive region. For example, the semiconductor structure 50 can include a sufficient number of reflective regions 56 and transparent regions 58 arranged in conjunction with the vertically conductive region 52 to meet such a condition. Still further, an illustrative arrangement of regions can include regions of two or more types laterally adjacent to one another (e.g., joined). For example, a semiconductor structure can include an arrangement in which transparent or reflective regions are laterally adjacent to vertically conductive regions.

Figure 5:
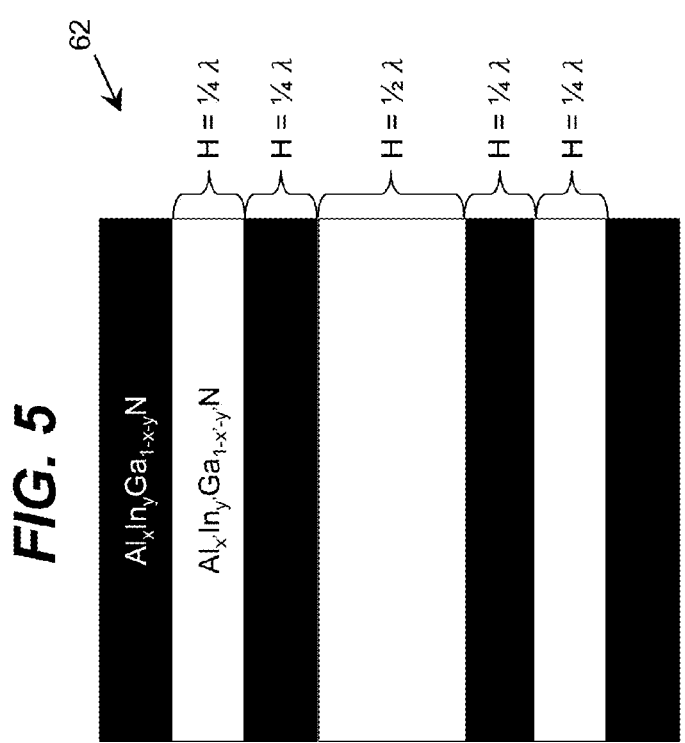
FIG. 5 shows a structure for an illustrative Fabry-Perot interference filter according to an embodiment.

In an embodiment, a transparent region, such as one or more of the transparent regions 58, comprises an $Al_xIn_yGa_{1-x-y}N/Al_{x'}In_{y'}Ga_{1-x'-y'}N$ superlattice with x, y, x' and y' chosen such that the transparency of the superlattice is at least ten percent for a target wavelength of radiation. In another embodiment, the transparent region can be configured to form a Fabry-Perot interference filter for a target wavelength of radiation. For example, FIG. 5 shows a structure for an illustrative Fabry-Perot interference filter 62 according to an embodiment. In this case, the filter 62 comprises a superlattice including a series of alternating layers of $Al_xIn_yGa_{1-x-y}N/Al_{x'}In_{y'}Ga_{1-x'-y'}N$, where x and x' molar fractions are larger than 0.35. The molar fractions x, x' are chosen to improve a transparency of the layers within the superlattice to radiation having a target wavelength. In an embodiment, y and y' are both zero (i.e., the layers do not include indium). Each layer in the superlattice has a thickness of approximately one quarter the target wavelength ($\lambda$), except for a middle layer having a thickness of approximately one half the target wavelength. In this manner, the filter 62 only transmits radiation having the target wavelength. In another embodiment, the transparent region 58 includes aluminum oxide ($Al_2O_3$), fused silica, aluminum nitride, or the like which can be deposited by means of thermal evaporation, magnetron sputtering, ion-beam deposition, or laser beam evaporation, and/or the like.

Figure 6:
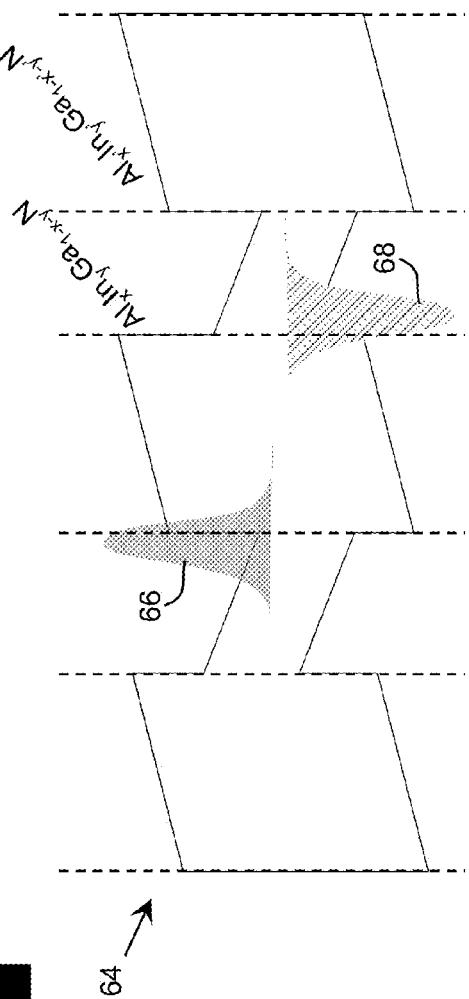
FIG. 6 shows a band diagram of an illustrative embodiment of a horizontally conductive material according to an embodiment.

As discussed herein, a semiconductor structure can include a material having an enhanced horizontal conductivity (e.g., the background base semiconductor structure 54 of FIG. 4). FIG. 6 shows a band diagram 64 of an illustrative embodiment of a horizontally conductive material according to an embodiment. In this case, the material comprises an $Al_xIn_yGa_{1-x-y}N/Al_{x'}In_{y'}Ga_{1-x'-y'}N$ superlattice having barriers and quantum wells alternating along a height of the material. Regions 66 and 68 correspond to localized concentration of electrons and holes, respectively, and result in the formation of two dimensional carrier gases. In particular, region 66 results in the formation of a two dimensional electron gas (2DEG), while region 68 results in the formation of a two dimensional hole gas (2DHG). The carrier gases have a high mobility in the lateral direction, which results in a horizontally conductive layer. In general, higher changes in band gap produce larger polarization fields, which can lead to an increase concentration of the carrier gases. In an illustrative example, a superlattice including layers of $GaN/Al_{0.3}Ga_{0.7}N$ provides a horizontally conductive material superlattice. In another embodiment, more than a two percent change in band gap is desired for formation of 2DEG.

As discussed herein, regions of any of the types (e.g., reflective, transparent, or conductive), can be located in various arrangements within a semiconductor structure. To this extent, FIGS. 7A-7C show illustrative arrangements of reflective regions according to embodiments. In FIG. 7A, a semiconductor base layer 70 is located adjacent to a metal contact 72 and includes two levels 74A, 74B of reflective regions. Each level 74A, 74B of reflective regions is immersed in the semiconductor base layer 70. Additionally, reflective regions located in level 74B are laterally offset (staggered) from reflective regions located in level 74A. In an embodiment shown more clearly in a top view shown in FIG. 7C, the levels 74A, 74B of reflective regions can be staggered in a manner that forms a checkerboard arrangement. In FIG. 7B, a first level 76A of reflective regions is located adjacent to an interface of the semiconductor base layer 70, while a second level 76B of reflective regions penetrates the metal contact 72. It is understood that these arrangements are only illustrative of various possible arrangements of regions.

FIGS. 8A and 8B show illustrative reflective regions 80A, 80B comprising omnidirectional mirrors according to embodiments. The mirror for each reflective region 80A, 80B comprises a low refractive index layer 82 located within a contact layer, such as the p-type contact layer 22. Additionally, each reflective region 80A, 80B comprises a highly reflective layer 84 located adjacent to an opposite side of the low refractive index layer 82 as the active region 18. Reflective region 80B further includes a distributed dielectric mirror 86 located between the low refractive index layer 82 and the highly reflective layer 84. The reflective regions 80A, 80B can further include a set of conductive regions 88, each of which can extend from the contact layer 22 to the highly reflective layer 84. The conductive regions 88 can comprise metallic or other conductive material regions. In an embodiment, the conductive regions 88 can be fabricated by etching the low refractive index layer 82 and distributed dielectric mirror 86 to access the contact layer 22 located underneath.

A semiconductor structure can include any combination and/or arrangement of the various types of regions, which can be selected based on a set of performance requirements for the semiconductor structure and/or the corresponding device. In an embodiment, the semiconductor structure can include vertically and horizontally conductive regions arranged to form an interconnected network of conductive paths through the semiconductor structure. The term "interconnected" network does not necessarily imply that all the conductive regions form a single network. As used herein, the term is applied loosely and includes clusters of overlapping conductive regions disconnected by gaps. In an embodiment, a typical cluster size and cluster density is chosen to match a conductivity requirement of the semiconductor structure. For example, for a semiconductor structure formed adjacent to a p-type contact, the cluster density and cluster size can be chosen to provide such conductivity of the p-type contact that a voltage drop across the p-type contact is ten percent or less than a voltage drop across the entire device.

As discussed herein, an embodiment of the semiconductor structure can be included in an optoelectronic device, such as a light emitting diode, a deep ultraviolet light emitting diode, a light sensor, other types of optoelectronic solid state devices, and/or the like. In a more specific embodiment, the semiconductor structure is incorporated in such a device to improve light extraction characteristics of the corresponding device. Returning to FIGS. 1 and 2, a semiconductor structure described herein can be incorporated as some or all of the p-type contact layer 22 and/or n-type contact layer 16.

In an embodiment of the device 10 shown in FIG. 1 or FIG. 2, a metallic contact 24 and/or a metallic contact 28 can comprise a multilayered structure. For example, the metallic contact 24, 28 can include an ohmic layer adjacent to the corresponding contact layer 22, 16, respectively, followed by a reflective layer located adjacent to the ohmic layer. The ohmic layer can be transparent to radiation having a target wavelength as described herein, while the reflective layer can be reflective to radiation having the target wavelength. In a more specific embodiment, the ohmic layer allows at least twenty percent of radiation having a target wavelength, which is radiated at a normal incidence to an interface of the ohmic layer, to pass there through. In another more specific embodiment, the reflective layer reflects at least fifty percent of radiation having the target wavelength, which is radiated at a normal incidence to an interface of the reflective layer. In an embodiment, the target wavelength corresponds to ultraviolet light, e.g., within a range of wavelengths between approximately 260 and approximately 360 nanometers.

Figure 9:
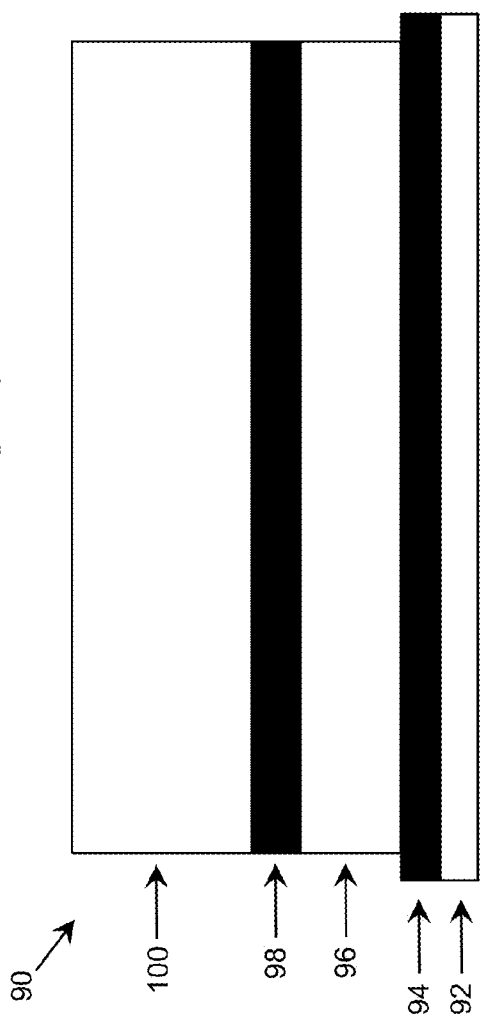
FIG. 9 shows an illustrative multilayered metallic contact according to an embodiment.

A metallic contact 24 and/or a metallic contact 28 can include one or more additional layers, e.g., to improve stability, reflectivity, and/or conductive properties of the ohmic contact. For example, FIG. 9 shows an illustrative multilayered metallic contact 90 according to an embodiment. In this case, the contact 90 includes an ohmic layer 92, an ohmic protective layer 94, a reflective layer 96, a reflective protective layer 98, and a conductive metallic layer 100. Each layer 92, 94, 96, 98, 100 can be formed of any suitable material and can be fabricated using any solution. For example, the ohmic contact layer 92 can be one of: cobalt (Co), nickel (Ni), palladium (Pd), iron (Fe), platinum (Pt), or the like. Additionally, the ohmic contact layer 92 can include one or sub-layers of metals. Such a sub-layer can include the above metals as well as: Pd, rhodium (Rh), ruthenium (Ru), osmium (Os), iridium (Ir), thorium (Th), and boron (B), and can incorporate one or more of: calcium (Ca), magnesium (Mg), beryllium (Be), manganese (Mn), or tin (Sn), with a maximum concentration up to approximately $10^{21}$ cm$^{-3}$. For example, the ohmic layer 92 can include: a sub-layer of Co/Mg/Ni having a thickness of approximately one to two nanometers, which can act as an adhesive; a two to five nanometer sub-layer of palladium, which can provide a good ohmic contact; and a sub-layer of rhodium having a thickness of approximately 150 Angstroms. The ohmic protective layer 94 can comprise: Pt, rhenium (Re), Pd, Rh, Ru, Os, Ir, or the like; an oxide, such as indium tin oxide (ITO), zinc oxide (ZnO), or the like;

and/or the like. The ohmic protective layer 94 can be as thick as few tens of nanometers. The reflective layer 96 can comprise Al, and be relatively thick (e.g., as much as a few hundred nanometers). A reflective protective layer 98 can comprise titanium (Ti), zirconium (Zr), hafnium (Hf), molybdenum (Mo), tungsten (W), Pd, Rh, Ru, Os, Ir, vanadium (V), chromium (Cr), Pt, or their allows. A conductive metallic layer 100 can comprise a lyaer of any type of material having a high electrical conductivity, including copper (Cu), silver (Ag), gold (Au), nickel (Ni), or their alloys.

An ohmic layer and/or reflective layer of a metallic contact 24 and/or a metallic contact 28 can be discontinuous. For example, a layer can comprise a plurality of island formations. The island formations can have a characteristic size of between ten to two thousand nanometers (up to one hundred thousand nanometers in another embodiment) and can be separated from one another by a characteristic distance of approximately the same order as the characteristic size of the islands. In an embodiment, the ohmic and reflective islands are interspersed with each other. Similarly, a semiconductor layer located adjacent to a metallic contact 24 and/or a metallic contact 28 can have a laterally inhomogeneous structure.

Figure 10:
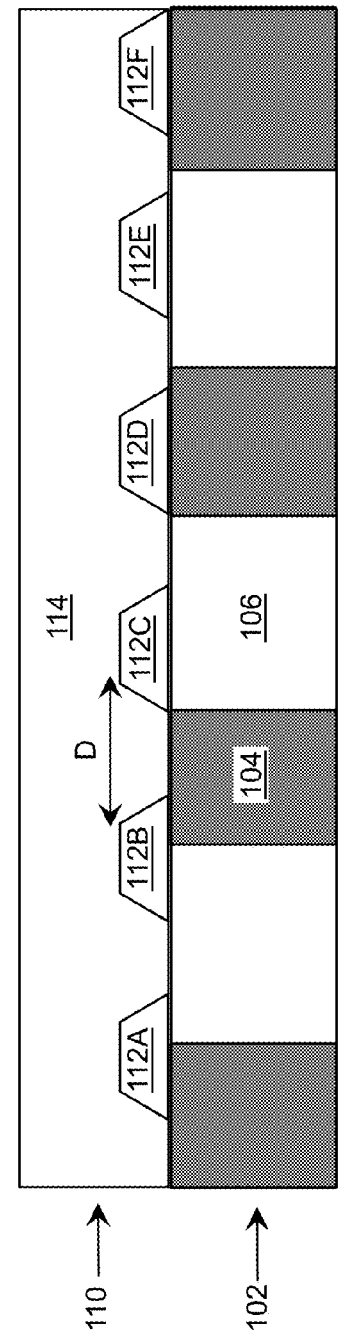
FIG. 10 shows an illustrative interface between a semiconductor layer and a metallic contact according to an embodiment.

For example, FIG. 10 shows an illustrative interface between a semiconductor layer 102 and a metallic contact 110 according to an embodiment. The semiconductor layer 102 is shown including laterally adjacent regions 104, 106, which can have distinct properties. In an embodiment, a first set of regions 104 comprise conductive regions, while a second set of regions 106 comprise transparent or reflective regions. The metallic contact 110 is shown having an ohmic layer formed of a plurality of ohmic islands 112A-112F, over which a reflective layer 114 can be located. The ohmic islands 112A-112F can be randomly located or patterned. Furthermore, an alignment of the ohmic islands 112A-112F with respect to the regions 104, 106 of the semiconductor layer 102 can be random or predetermined. In the latter case, any solution can be utilized for the alignment including for example, semiconductor layer patterning and overgrowth, ohmic layer patterning, and/or the like. As illustrated, a characteristic distance D between the ohmic islands 112A-112F can be comparable to a characteristic lateral size of the ohmic islands 112A-112F.

FIGS. 11A-11C show illustrative n-type contact layers 116A-116C, respectively, including reflective regions 118 according to embodiments. The reflective regions 118 can comprise, for example, superlattices of $Al_xIn_yGa_{1-x-y}N/Al_{x'}In_{y'}Ga_{1-x'-y'}N$ layers, which can be grown epitaxially. Since the n-type contact layers 116A, 116B can have thicknesses of several microns, relatively thick composite reflective regions 118 can be utilized which can lead to a higher degree of reflection. As illustrated in FIG. 11A, inclusion of the reflective regions 118 in the n-type contact layer 116A can provide a more efficient reflection of radiation towards the p-type contact 24. For an efficient extraction of radiation from the device 111, the p-type contact 24 and the p-type contact layer 22 should be transparent to the radiation generated by the active region 18 (e.g., transmitting at least thirty percent of the radiation of a target wavelength in an embodiment).

As shown in FIGS. 11B and 11C, a n-type metal contact 120A-120C can include metallic protrusions 122 extending into the n-type contact layer 116B, 116C. Furthermore, as shown in FIG. 11C, a n-type contact layer 116C can include conductive regions 124A, 124B having high horizontal conductivity in a location of the protrusions 122. The protrusions 122 can deliver the current to the horizontally conductive regions 124A, 124B, which can spread the current horizontally to other regions having a high vertical conductivity (e.g., the background base semiconductor structure of the n-type contact layer 116C). Furthermore, a n-type metal contact, such as the metal contact 120C, can be adjacent to region(s) of high vertical conductivity. The metal contact 120C provides a vertical design for the n-type contact structure and can be included alone or in combination with the horizontal designed metal contacts 120A, 120B. In an embodiment, the metal contact 120C is formed by removing a substrate used for epitaxial growth of the semiconductor layer(s) and depositing the n-type metal contact 120C on the exposed surface of the semiconductor layer.

Various embodiments of the semiconductor structure described herein can be fabricated using any solution, including patterning, masking, epitaxial growth, and/or the like. An illustrative solution for producing a laterally inhomogeneous semiconductor structure includes depositing group III nitride semiconductor alloys under a faceted and/or three-dimensional growth mode as shown and described in U.S. Pat. No. 7,812,366. This solution is notably different from conventional approaches of growing AlGaN films and can lead to a surface morphology having large scale faceting evidencing metal droplets. In conventional approaches, the films are typically produced at a very high gallium flux, which results in a surface of the AlGaN film typically having a smooth morphology. In another embodiment described herein, inhomogeneous regions within a semiconductor structure can be produced using a MOCVD approach, which is distinctly different from the approach described in U.S. Pat. No. 7,812,366.

Ternary and quaternary nitride semiconductor epitaxial layers inherently grow inhomogeneously due to contrasting optimum growth conditions needed for respective binary layers. In an embodiment, inhomogeneity in aluminum-containing nitride layers is further enhanced by intentionally lowering a mobility of aluminum adatoms. For example, aluminum mobility on the growing surface is strongly influenced by growth temperature and V/III molar ratio. In an illustrative embodiment, three dimensional inhomogeneous structures are formed with V/III ratio being above 1000 (e.g., in a range between 1000 and 100000) and growth temperatures being in the range of 500-1300 degrees Celsius. Adjacent semiconductor layers can be grown using such a group V/III ratio and growth temperatures, while varying a molar fraction of one or more of the elements (e.g., a molar fraction of aluminum can differ by at least one percent between adjacent layers).

Figure 12:
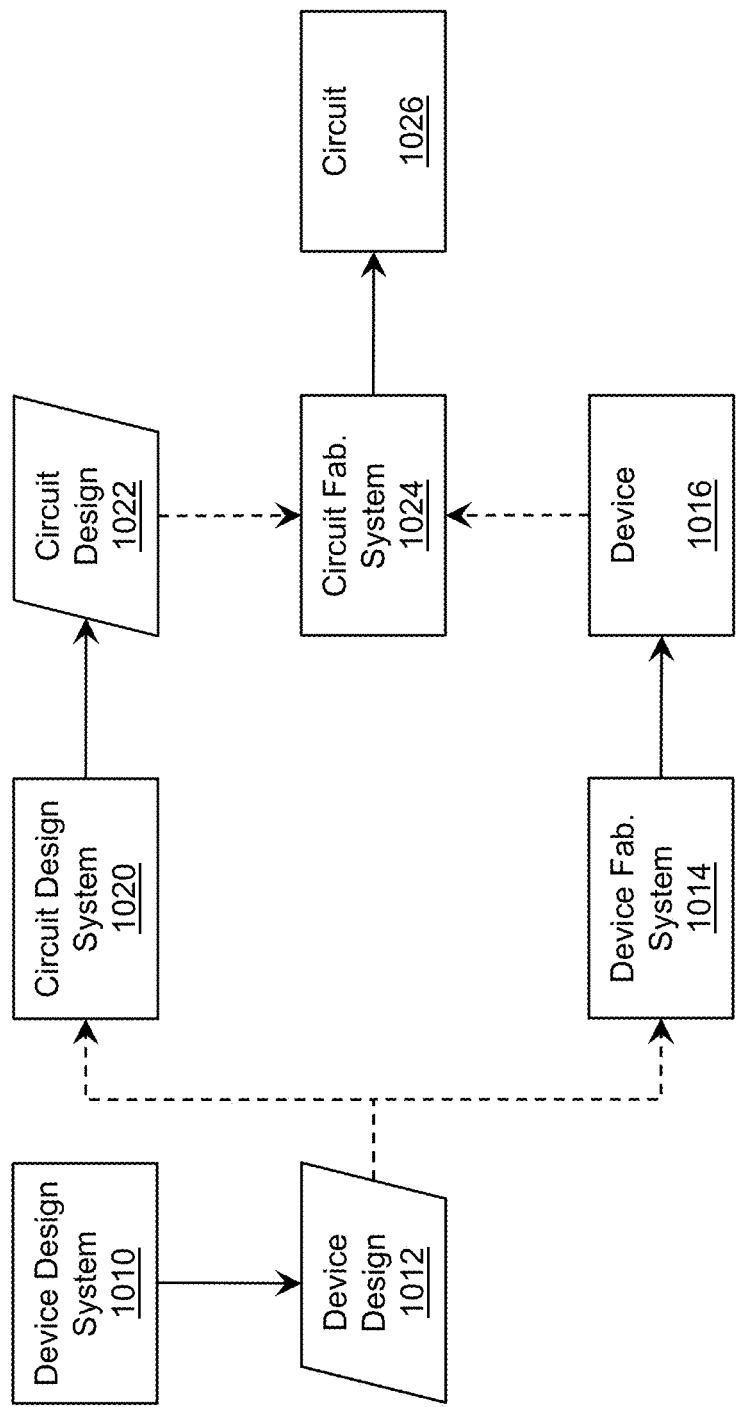
FIG. 12 shows an illustrative flow diagram for fabricating a circuit according to an embodiment.

In one embodiment, the invention provides a method of designing and/or fabricating a circuit that includes one or more of the devices designed and fabricated as described herein (e.g., including one or more emitting devices including a semiconductor structure described herein). To this extent, FIG. 12 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor heterostructure comprising:
a group III nitride semiconductor layer including a plurality of inhomogeneous regions, each inhomogeneous region having a set of attributes differing from a group III nitride material forming the semiconductor layer, wherein the plurality of inhomogeneous regions include:
a set of first inhomogeneous regions configured based on radiation having a target wavelength, wherein the set of first inhomogeneous regions are at least one of: transparent to the radiation or reflective of the radiation; and
a set of second inhomogeneous regions having a conductivity at least ten percent higher than a conductivity of the set of first inhomogeneous regions, wherein each of the sets of inhomogeneous regions occupy at least five percent of at least one of: a lateral planar area of the semiconductor layer or a volume of the semiconductor layer, and wherein at least some of the sets of inhomogeneous regions do not fully overlap.

2. The heterostructure of claim 1, wherein the set of second inhomogeneous regions includes at least one anisotropic conductive region.

3. The heterostructure of claim 1, wherein the set of first inhomogeneous regions includes:
a set of transparent regions; and
a set of reflective regions.

4. The heterostructure of claim 1, wherein the set of first inhomogeneous regions includes a set of reflective regions, and wherein a reflective region in the set of reflective regions is formed of a composite mirror.

5. The heterostructure of claim 4, wherein the composite mirror comprises a Bragg mirror formed by layers of low index of refraction material alternating with layers of high index of refraction material, wherein the layers of low index of refraction material are selected from a group consisting of: silicon dioxide (SiO2), magnesium oxide (MgO), and magnesium fluoride (MgF2), and wherein the layers of high index of refraction material are selected from a group consisting of: aluminum oxide ($Al_2O_3$), scandium oxide ($Sc_2O_3$), magnesium aluminum oxide ($MgAl_2O_3$), and a group III nitride.

6. The heterostructure of claim 1, wherein the set of first inhomogeneous regions includes at least one region both transparent and reflective of the radiation.

7. The heterostructure of claim 1, wherein the set of first inhomogeneous regions includes at least one transparent region forming a Fabry-Perot interface filter for the radiation.

8. The heterostructure of claim 1, wherein at least one first inhomogeneous region is laterally adjacent to at least one second inhomogeneous region.

9. The heterostructure of claim 1, wherein the set of first inhomogeneous regions are arranged in a plurality of levels, and wherein first inhomogeneous regions in a first level are offset from first inhomogeneous regions in a second level.

10. The heterostructure of claim 1, further comprising:
an active region; and
a metallic contact, wherein the semiconductor layer is located between the active region and the metallic contact.

11. An optoelectronic device comprising:
an active region;
a p-type contact layer located on a first side of the active region; and
a n-type contact layer located on a second side of the active region, wherein at least one of the contact layers comprises a group III nitride semiconductor layer including a plurality of inhomogeneous regions, each inhomogeneous region having a set of attributes differing from a group III nitride material forming the semiconductor layer, wherein the plurality of inhomogeneous regions include:
a set of first inhomogeneous regions configured based on radiation having a target wavelength, wherein the set of first inhomogeneous regions are at least one of: transparent to the radiation or reflective of the radiation; and
a set of second inhomogeneous regions having a conductivity at least ten percent higher than a conductivity of the set of first inhomogeneous regions, wherein each of the sets of inhomogeneous regions occupy at least five percent of at least one of: a lateral planar area of the semiconductor layer or a volume of the semiconductor layer, and wherein at least some of the sets of inhomogeneous regions do not fully overlap.

12. The device of claim 11, further comprising:
a p-type metallic contact adjacent to at least a portion of the p-type contact layer; and
a n-type metallic contact adjacent to at least a portion of the n-type contact layer.

13. The device of claim 12, wherein the p-type metallic contact comprises a multilayered structure including:
an ohmic layer immediately adjacent to the at least a portion of the p-type contact layer, the ohmic layer being transparent to the radiation; and
a reflective layer located adjacent to the ohmic layer.

14. The device of claim 12, wherein at least one of the set of first inhomogeneous regions is partially located in both the contact layer and the metal contact.

15. The device of claim 12, wherein the n-type contact layer includes the sets of first and second inhomogeneous regions, and wherein the set of second inhomogeneous regions includes at least one horizontally conductive region adjacent to the n-type metal contact.

16. The device of claim 15, wherein the n-type metal contact includes a set of protrusions into the n-type contact layer.

17. The device of claim 12, wherein the n-type metal contact comprises a vertical design.

18. A method comprising:
fabricating a semiconductor heterostructure, wherein the semiconductor heterostructure comprises:
a group III nitride semiconductor layer including a plurality of inhomogeneous regions, each inhomogeneous region having a set of attributes differing from a group III nitride material forming the semiconductor layer, wherein the plurality of inhomogeneous regions include:
a set of first inhomogeneous regions configured based on radiation having a target wavelength, wherein the set of first inhomogeneous regions are at least one of: transparent to the radiation or reflective of the radiation; and
a set of second inhomogeneous regions having a conductivity at least ten percent higher than a conductivity of the set of first inhomogeneous regions, wherein each of the sets of inhomogeneous regions occupy at least five percent of at least one of: a lateral planar area of the semiconductor layer or a volume of the semiconductor layer, and wherein at least some of the sets of inhomogeneous regions do not fully overlap.

19. The method of claim 18, further comprising forming a metal contact immediately adjacent to the group III nitride semiconductor layer.

20. The method of claim 18, wherein the fabricating includes:
epitaxially growing a portion of the group III nitride semiconductor layer;
forming at least one of the sets of inhomogeneous regions on a surface of the portion of the group III nitride semiconductor layer; and
epitaxially over-growing the group III nitride semiconductor layer after the forming.

21. The method of claim 20, wherein the forming includes:
depositing the at least one of the sets of inhomogeneous regions using one of: thermal evaporation, magnetron sputtering, ion-beam deposition, or laser beam evaporation; and
patterning the at least one of the sets of inhomogeneous regions using photolithography.

* * * * *